United States Patent
Mitteer et al.

(10) Patent No.: US 12,401,245 B2
(45) Date of Patent: Aug. 26, 2025

(54) CIRCUIT BOARD FOR STATOR WINDINGS HAVING INTEGRAL SECURING STRUCTURES

(71) Applicant: GHSP, Inc., Holland, MI (US)

(72) Inventors: David Michael Mitteer, Shelby, MI (US); Bradley John Vecellio, Spring Lake, MI (US)

(73) Assignee: GHSP, Inc., Holland, MI (US)

( * ) Notice: Subject to any disclaimer, the term of this patent is extended or adjusted under 35 U.S.C. 154(b) by 524 days.

(21) Appl. No.: 17/789,547

(22) PCT Filed: Dec. 10, 2020

(86) PCT No.: PCT/IB2020/061783
§ 371 (c)(1),
(2) Date: Jun. 28, 2022

(87) PCT Pub. No.: WO2021/140381
PCT Pub. Date: Jul. 15, 2021

(65) Prior Publication Data
US 2023/0032339 A1    Feb. 2, 2023

Related U.S. Application Data

(60) Provisional application No. 62/959,459, filed on Jan. 10, 2020.

(51) Int. Cl.
*H02K 3/12*    (2006.01)
*H02K 1/16*    (2006.01)
*H05K 1/18*    (2006.01)

(52) U.S. Cl.
CPC .............. *H02K 3/12* (2013.01); *H02K 1/16* (2013.01); *H05K 1/181* (2013.01); *H05K 2201/1009* (2013.01)

(58) Field of Classification Search
CPC ........ H02K 3/12; H02K 1/16; H02K 2203/09; H02K 2203/12; H02K 11/33; H05K 1/181;
(Continued)

(56) References Cited

U.S. PATENT DOCUMENTS

2002/0153787 A1* 10/2002 Hollenbeck ............ H02K 29/08
310/68 R
2007/0138883 A1    6/2007 Cho
(Continued)

FOREIGN PATENT DOCUMENTS

CN    103904831 A    7/2014
CN    205811695      12/2016
(Continued)

*Primary Examiner* — Mohamad A Musleh
(74) *Attorney, Agent, or Firm* — Price Heneveld LLP

(57) ABSTRACT

A stator of an electric motor includes a stator core having a plurality of teeth. A printed circuit board (PCB) is fixed with respect to the stator and includes a plurality of soldering structures defined within a surface of the printed circuit board. A winding set is disposed on the teeth. The winding set includes at least one wire that is wound around the teeth to at least partially define stator poles. Each wire of the winding set includes opposing ends that are attached to the printed circuit board at a dedicated soldering structure of the plurality of soldering structures.

20 Claims, 6 Drawing Sheets

(58) Field of Classification Search
CPC . H05K 2201/1009; H05K 2201/09163; H05K 1/117; H05K 2201/10287; H05K 3/3426; Y02P 70/50
See application file for complete search history.

(56) References Cited

U.S. PATENT DOCUMENTS

| | | |
|---|---|---|
| 2008/0202795 A1 | 8/2008 | Yin |
| 2012/0307476 A1* | 12/2012 | Masuzawa ............. H02K 11/33 |
| | | 361/816 |

FOREIGN PATENT DOCUMENTS

| | | | |
|---|---|---|---|
| CN | 107040056 A | | 8/2017 |
| JP | H05191942 A | | 7/1993 |
| JP | H05191943 | | 7/1993 |
| JP | 2001501799 A | | 2/2001 |
| JP | 2019017227 A | | 1/2019 |
| KR | 910010200 B1 | * | 12/1991 |
| KR | 20140024078 | | 2/2014 |
| KR | 20140024078 A | * | 2/2014 |
| SE | 9003359 | | 4/1992 |

\* cited by examiner

CIRCUIT BOARD FOR STATOR WINDINGS HAVING INTEGRAL SECURING STRUCTURES

FIELD OF THE INVENTION

The present invention generally relates to electric motors, and more specifically, securing structures for maintaining a position of a winding for a stator of an electric motor.

BACKGROUND OF THE INVENTION

Conventional electric motors typically include a stator having a winding that extends around teeth of a stator core. These wires are connected to a controller via a printed circuit board. The entire assembly is then overmolded or encased within a plastic material to form the structure of the stator for the electric motor. These conventional electric motors contain an intermediate conductive element between magnet wire and the printed circuit board controller. These intermediate conductive elements, commonly referred to as terminals, require specific components, such as the terminal itself, and manufacturing processes to electrically connect the terminal to the magnet wire. Added manufacturing processes are also needed to electrically connect the terminal to the printed circuit board.

SUMMARY OF THE INVENTION

According to one aspect of the present invention, a stator of an electric motor includes a stator core having a plurality of teeth. A printed circuit board (PCB) is fixed with respect to the stator and includes a plurality of soldering structures defined within a surface of the printed circuit board. A winding set is disposed on the teeth. The winding set includes at least one wire that is wound around the teeth to at least partially define stator poles. Each wire of the winding set includes opposing ends that are attached to the printed circuit board at a dedicated soldering structure of the plurality of soldering structures.

According to another aspect of the present invention, a stator of an electric motor includes a stator core having a plurality of teeth. A printed circuit board (PCB) is attached to the stator core and having a plurality of soldering structures defined therein. A winding set is made up of at least one wire. Each wire of the at least one wire extends from a first end that is attached to a first soldering structure of the plurality of soldering structures, around at least a portion of the plurality of teeth and to a second end that is attached to a second soldering structure of the plurality of soldering structures. Each wire is a continuous section of wire that is free of intermediate terminals.

According to another aspect of the present invention, an electric motor includes a printed circuit board. A wire-securing structure is positioned proximate the printed circuit board. A stator includes a plurality of poles. A wire extends from a first end attached to the printed circuit board at a first soldering pad, through a first portion of the wire-securing structure, around at least a portion of the poles of the plurality of poles, through a second portion of the wire-securing structure and to a second end attached to the printed circuit board at a second soldering pad. The wire includes a continuous and uninterrupted conductor.

These and other aspects, objects, and features of the present invention will be understood and appreciated by those skilled in the art upon studying the following specification, claims, and appended drawings.

DETAILED DESCRIPTION OF THE PREFERRED EMBODIMENTS

Figure 1:
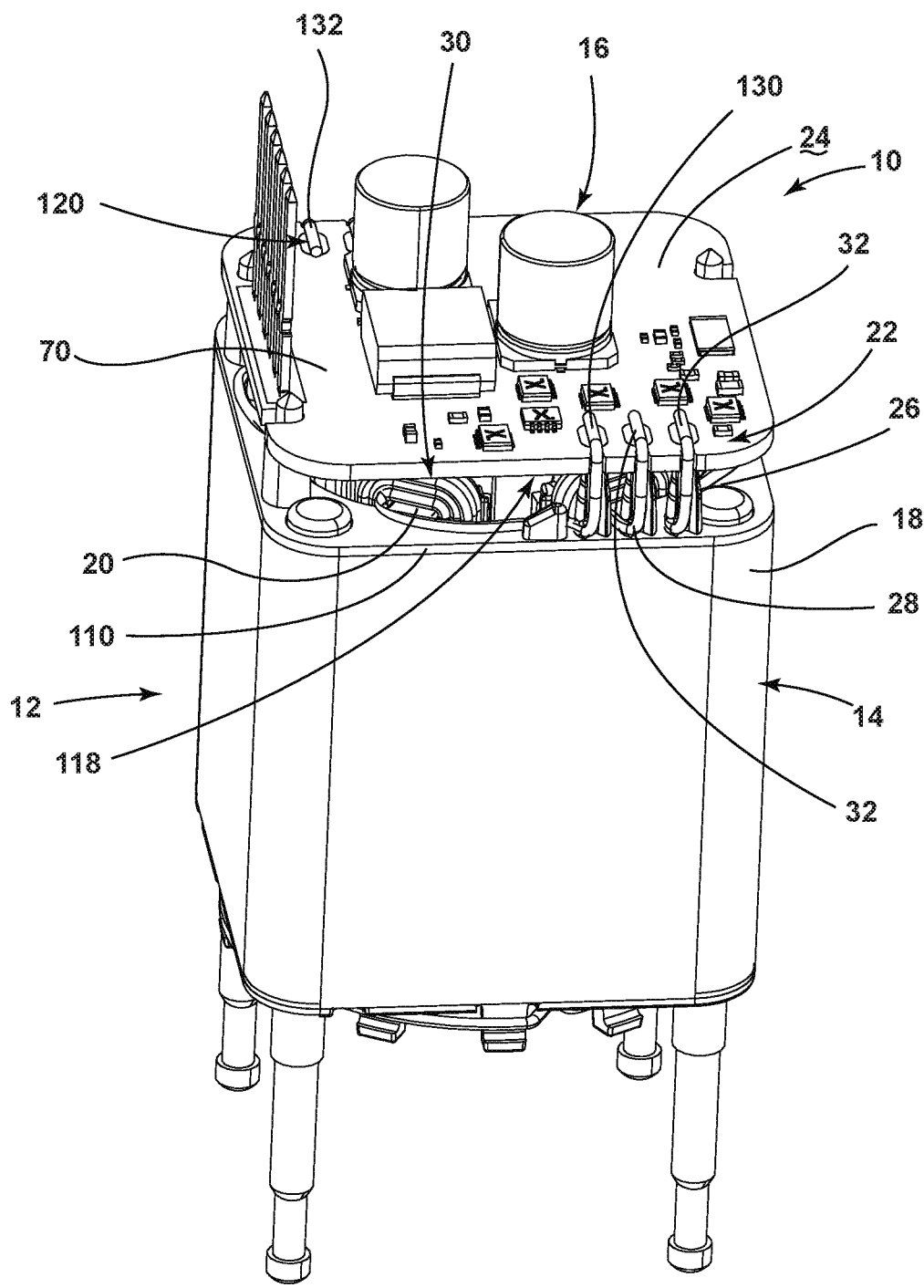
FIG. 1 is a perspective view of a stator for an electric motor that incorporates an aspect of the soldering structures for attaching the windings to a printed circuit board.
Figure 2:
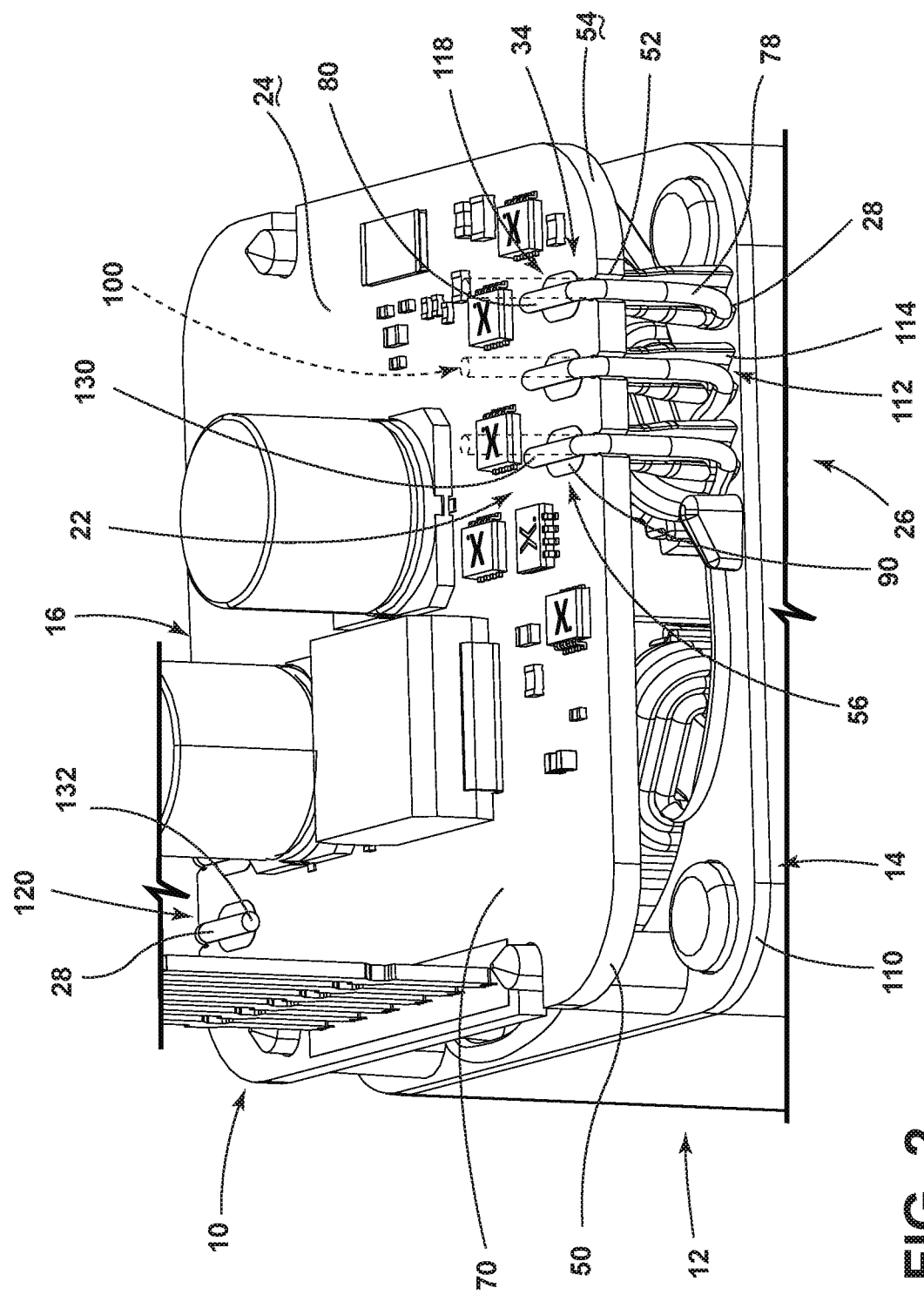
FIG. 2 is an enlarged perspective view of the soldering structures of FIG. 1.
Figure 3:
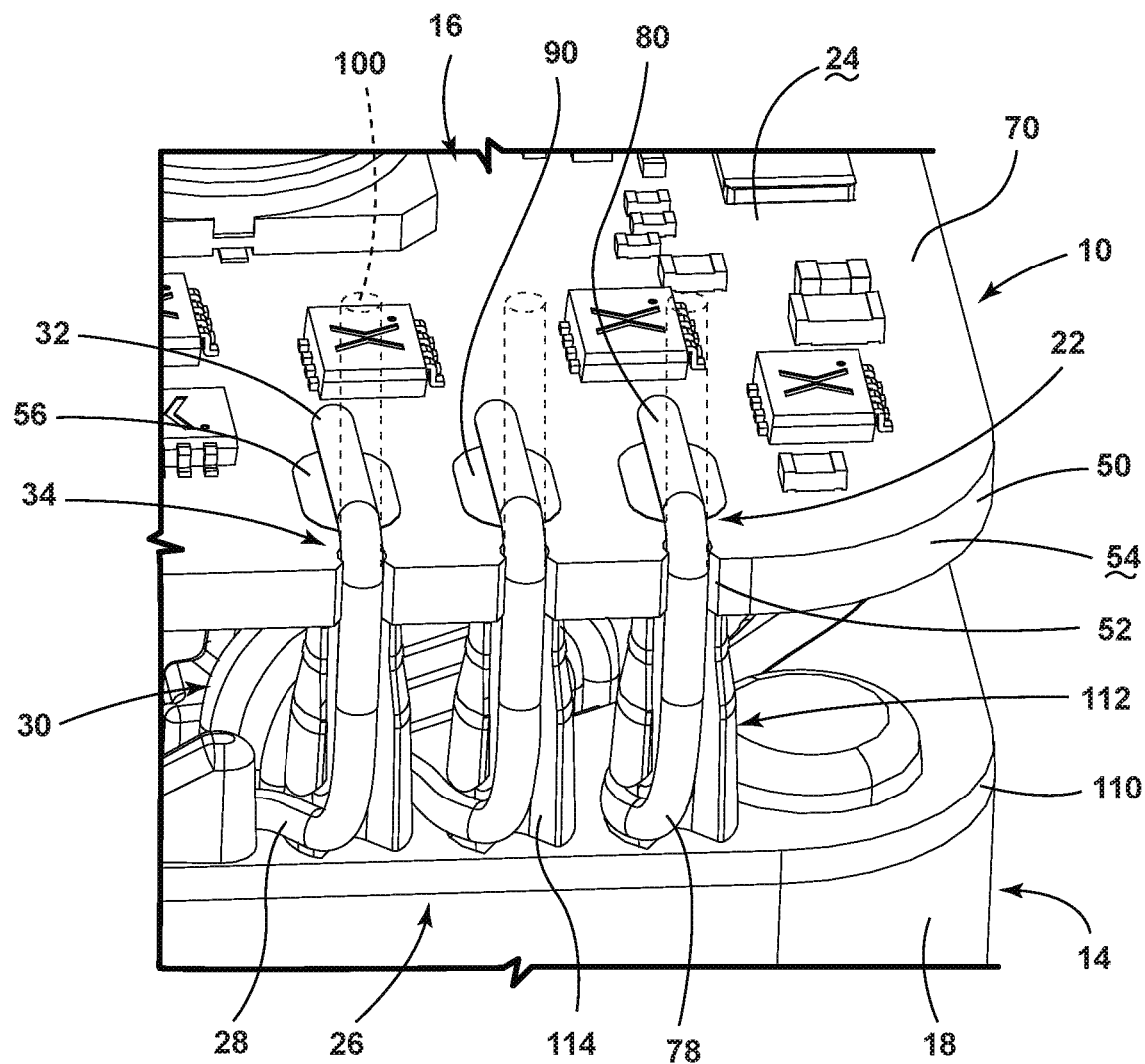
FIG. 3 is a perspective view of an aspect of the stator and printed circuit board and showing a configuration of the soldering structures.
Figure 4:
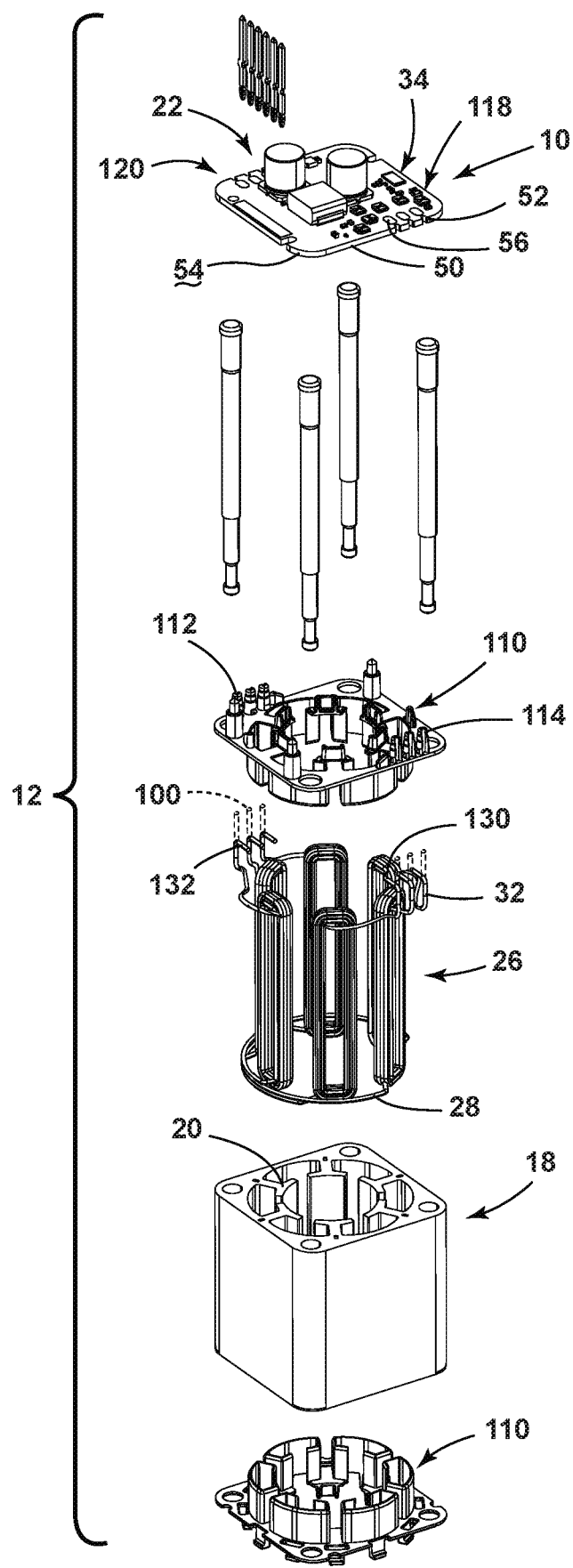
FIG. 4 is an exploded perspective view of the stator of FIG. 1.
Figure 5:
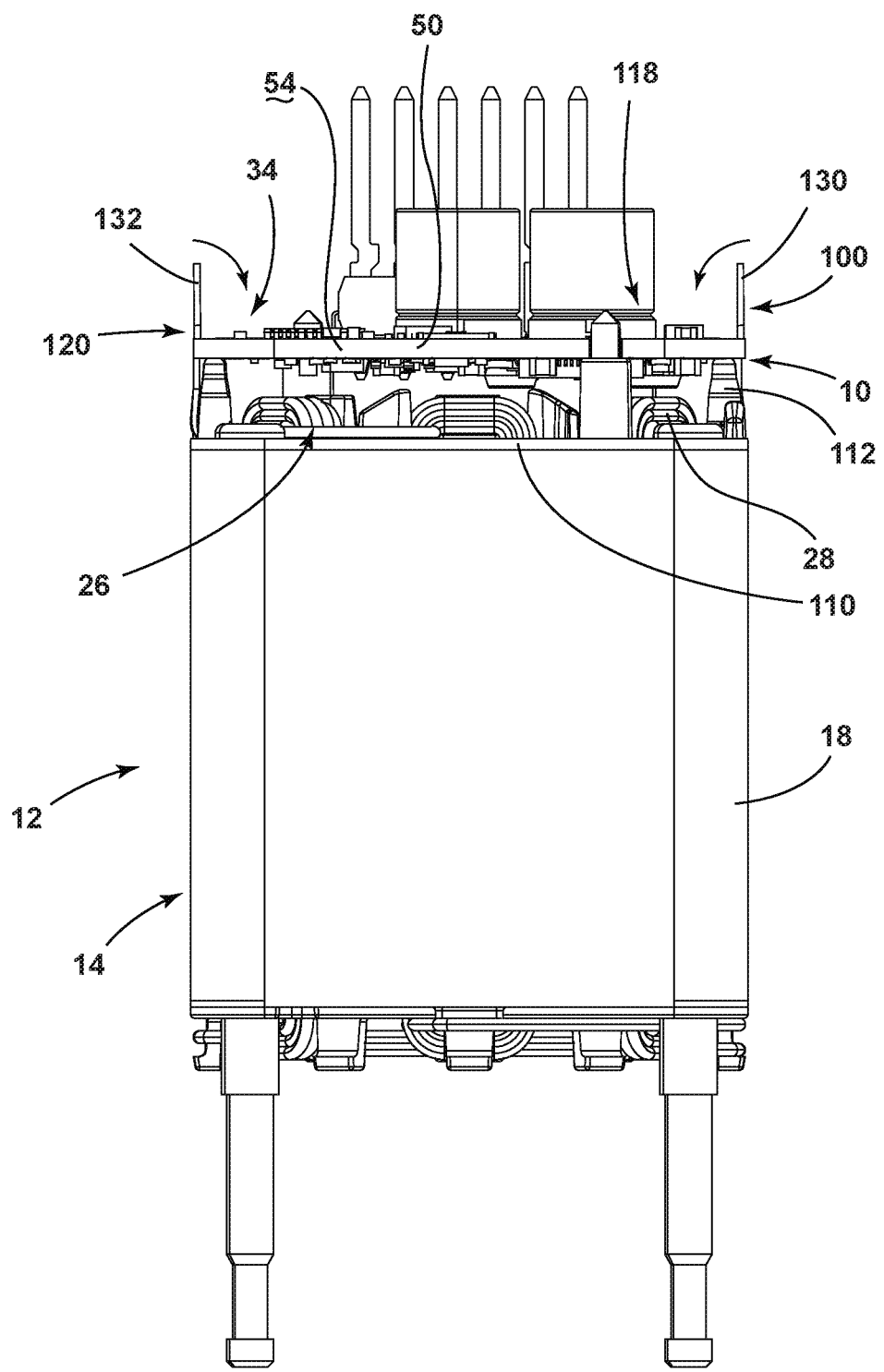
FIG. 5 is a side elevational view of the stator of FIG. 1 and showing the wires of the wire set placed in a soldering position.
Figure 6:
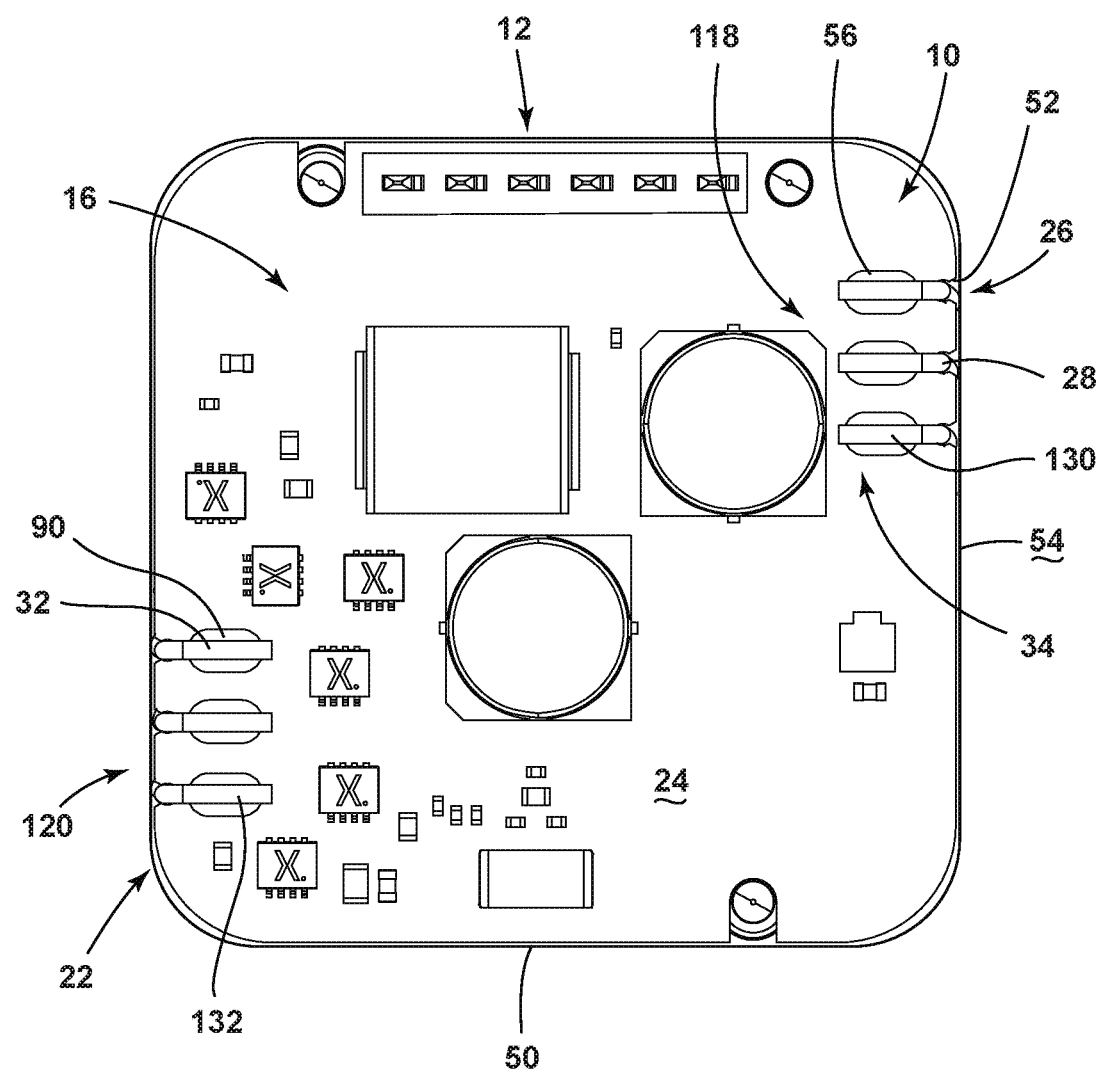
FIG. 6 is a top plan view of the stator of FIG. 1 and showing engagement of the wires of the wire set with the dedicated soldering pads.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

As exemplified in FIGS. 1-6, reference numeral 10 generally refers to a printed circuit board (PCB) that is incorporated within an electric motor 12. The PCB 10 is placed in a fixed position with respect to a stator 14, such that the various controls 16 for operating components of the stator 14 can be secured thereto during operation of the electric motor 12. According to various aspects of the device, the stator 14 for an electric motor 12 includes a stator core 18 having a plurality of teeth 20. The PCB 10 is fixed with respect to the stator core 18 and includes a plurality of soldering structures 22 defined within the surface 24 of the PCB 10. A winding set 26 is disposed on the teeth 20 of the stator core 18. The winding set 26 includes at least one wire 28 that is wound around the teeth 20 of the stator core 18 to at least partially define a plurality of stator poles 30 of the stator 14. Typically, the winding set 26 includes a plurality of wires 28 that are each wound in a predetermined configuration around the various teeth 20 of the stator core 18. Each wire 28 of the winding set 26 includes opposing ends 32 that are attached to the PCB 10 at a dedicated soldering structure 34 of the plurality of soldering structures 22. Using the soldering structures 34, each of the various wires 28 can be installed on the stator 14 and the PCB 10 as a single and continuous section of wire 28. By using a single and continuous wire 28, intermediate terminals and other electrical junctions are not included within the wires 28 of the winding set 26.

As exemplified in FIGS. 1-6, the plurality of soldering structures 22 are defined proximate an edge 50 of the PCB 10. Each soldering structure 22 can include a securing notch 52 that is defined within the edge surface 54 of the PCB 10. Each securing notch 52 is typically aligned with a corresponding tinned soldering pad 56 that receives a respective end 32 of each wire 28 of the winding set 26. The securing notch 52 and the corresponding soldering pad 56 cooperate to make up at least a portion of each respective soldering structure 22 of the PCB 10. The number of soldering structures 22, in certain aspects, can correspond to the number of wires 28 in the winding set 26. It is also contemplated that the PCB 10 can include a set number of soldering structures 22 to account for a wide range of wires 28 and a variety of winding sets 26.

Referring again to FIGS. 1-6, the corresponding tinned soldering pads 56 are pre-tinned during manufacture of a PCB 10. As the various circuitry is printed on the base material 70 of the PCB 10, the various soldering pads 56 of the plurality of soldering structures 22 are also positioned within specific locations on the PCB 10. Typically, the pre-tinned soldering pads 56 are pre-tinned during the surface mount technology (SMT) process of manufacturing the PCB 10. Through this configuration, each securing notch 52 is aligned with a pre-tinned soldering pad 56 such that ends 32 of each wire 28 of the winding set 26 can be placed within a securing notch 52 and then prepared for soldering while each wire 28 is temporarily secured to the PCB 10.

It is contemplated that the use of the plurality of soldering structures 22 can assist in accurate placement of the opposing ends 32 of each of the wires 28 of the winding set 26. This can help to prevent crossed wires 28 and other inaccuracies that can lead to short circuits and other structural and electrical defects within a stator core 18. This configuration also provides for a feedback mechanism that informs a manufacturer that the PCB 10 is accurately located on the stator core 18 with respect to the various wires 28 of the winding set 26. In this manner, the securing notches 52 assist in at least temporarily securing the opposing ends 32 of each wire 28 for the winding set 26. The various securing notches 52 are configured to extend more than 180 degrees around an insulation layer 78 of the at least one wire 28 of the winding set 26. By extending more than 180 degrees around the insulation layer 78 of each wire 28, each securing notch 52 provides a clamping or other similar securing engagement to secure the at least one wire 28 in a soldering position 100. This soldering position 100 places the wires 28 of the winding set 26 in a convenient location to be stripped to expose the interior conductor 80. Once stripped, the interior conductor 80 can be conveniently folded at the securing notch 52 to engage the pre-tinned soldering pad 56. Once in this location, a soldering operation can occur to attach the conductor 80 of the wire 28 to the respective soldering pad 56. These operations are assisted through the retention of the ends 32 of each wire 28 within the securing notches 52. This retaining function allows for a hands-free system for stripping and soldering the wire 28.

These operations of placing the wires 28 within the securing notch 52, stripping the wires 28, folding the wires 28 and soldering the wires 28 to the soldering pad 56 can be accomplished by hand using manually operated tools, can be operated through automatic or robotic mechanisms or a combination of manual and automated processes. The soldering structures 22 provide an integral guide that positions the wires 28 during assembly and manufacture and also helps to protect the wires 28 during use.

Typically, the pre-tinned material of the soldering pads 56 is a soldering paste 90 that is applied during the SMT process. These soldering pads 56 are located in alignment with the various securing notches 52 for retaining, at least temporarily, the position of the wires 28 of the winding set 26 in the soldering position 100. Other soldering pads 56 can be located at positions around the PCB 10 for receiving other wires 28 of the winding set 26, as well as other data and electrical connections extending from the PCB 10 to other locations of the motor 12, controller or other similar mechanism operated in connection with the motor 12. When the various wires 28 of the winding set 26 are soldered to the pre-tinned soldering pads 56, various selective soldering processes can be utilized. These selective soldering processes can be implemented for providing accurate solders that minimize the use of soldering material as well as other electrical and material resources. This process also minimizes the crossing of wires 28 such that each wire 28 of the winding set 26 is accurately positioned within the PCB 10 and also soldered to the appropriate pre-tinned soldering pad 56.

Referring again to FIGS. 1-6, the stator 14 for the electric motor 12 includes the stator core 18 having the plurality of teeth 20. The PCB 10 is attached to the stator core 18 and includes a plurality of soldering structures 22 defined therein. The winding set 26 is made up of at least one wire 28, where each wire 28 of the at least one wire 28 extends from a first end 130 that is attached to a first dedicated soldering structure 118 of the plurality of soldering structures 22. Each wire 28 extends around at least a portion of the plurality of teeth 20 for the stator core 18. A second end 132 of each wire 28 is attached to a second dedicated soldering structure 120 of the plurality of soldering structures 22. As discussed previously, each wire 28 of the winding set 26 is a continuous section of wire 28 that is free of intermediate terminals. Accordingly, the process of installing the windings onto the stator core 18 and then attaching those windings to the PCB 10 can be performed in a less complicated procedure, when compared to those procedures that include intermediate terminals.

Referring again to FIGS. 1-6, the stator core 18 can include various caps 110 or other similar structures that may include aligning towers 112. These aligning towers 112 are typically aligned with respective securing notches 52 of the plurality of soldering structures 22. These aligning towers 112 can include a wire-receiving interior channel 114 that receives a wire 28 of the winding set 26. Using these aligning towers 112, the various wires 28 of the winding set 26 can be directed from the stator teeth 20 of the stator core 18 and can be specifically directed to engage a dedicated securing notch 52 of a dedicated soldering structure 34. Again, using the aligning towers 112 in combination with the plurality of soldering structures 22, each wire 28 of the winding set 26 can be specifically directed and accurately positioned within a particular location of the PCB 10 for accomplishing a precise selective solder process. Also, the aligning towers 112, in combination with the securing notches 52, can operate to protect the wires 28 during use of the stator core 18.

Through the use of the plurality of soldering structures 22 of the PCB 10, which include the securing notches 52 and the pre-tinned soldering pads 56, the at least one wire 28 of the winding set 26 can be in the form of a continuous wire 28 that is free of intermediate terminals. Accordingly, a single continuous wire 28 can be incorporated within the stator 14 for use as a wire 28 of the winding set 26 for the stator 14. Using this configuration, each wire 28 of the winding set 26 can be a single and continuous wire 28 that extends from a first dedicated soldering structure 118 of the PCB 10, around various teeth 20 of the stator core 18 and then to a second dedicated soldering structure 120 of the PCB 10. By using segments of continuous wire 28 for the winding set 26, minimal resources can be utilized for accomplishing the various winding processes of the winding set 26. Additionally, because no intermediary terminals are used within the wires 28 of the winding set 26, there is less of a chance of manufacturing defects or tolerances that might affect the performance of the various components of the electric motor 12.

Within conventional electric motors, the intermediary terminal located between magnet wire and the printed circuit board controller require additional components, at least in the form of the intermediary terminal itself and other connective components. Additional manufacturing processes are also needed within these conventional motors to electrically connect the intermediary terminal with each of the magnet wire and the printed circuit board controller. This is true for every coil wound in the conventional stator. These added components and processes can be a source of strain on the magnet wires and other components of the conventional motors that can result in material fatigue or failure in the magnet wires, the solder connections and other locations.

Referring again to FIGS. 1-6, an electric motor 12 includes a PCB 10 and a wire-securing structure that is positioned proximate to the PCB 10 in the form of the soldering structures 22. A stator 14 for the electric motor 12 includes a plurality of poles. These poles each include various wires 28 that make up a winding set 26 for the stator 14 of the electric motor 12. A wire 28 extends from a first end 130, which is attached to the PCB 10 at a soldering pad 56 of the first dedicated soldering structure 118. The wire 28 then extends through a first portion of a wire-securing structure, typically in the form of a securing notch 52. The wire 28 extends around at least a portion of the poles of the plurality of poles to form the various windings. The wire 28 extends to a second portion of the wire-securing structure that includes a second securing notch 52. As discussed herein, each of the securing notches 52 are defined within an edge 50 of the body of the PCB 10. The wire 28 includes a second end 132 that is attached to the PCB 10 at a soldering pad 56 of the second dedicated soldering structure 120. The wire 28 includes a continuous and uninterrupted conductor 80 that is free of intermediate terminals.

Referring again to FIGS. 1-6, first and second soldering pads 56 are positioned adjacent to respective securing notches 52 of the wire-securing structure. These securing notches 52 are defined within an edge 50 of the PCB 10. In operation, the respective securing notches 52 are configured to selectively fix the first and second ends 130, 132 of the wire 28 in a soldering position 100, in relation to the PCB 10. This soldering position 100 (shown in FIG. 5) is characterized by the first and second ends 130, 132 of the wire 28 being oriented to allow for stripping and soldering of the wire 28 while the first and second ends 130, 132 of the wire 28 are in the soldering position 100. Stated another way, the soldering position 100 places each of the first and second ends 130, 132 of the wire 28 in a generally perpendicular configuration with respect to the PCB 10. From this position, the first and second ends 130, 132 of the wire 28 are easily accessible to strip away the insulation layer 78 for the wire 28 and expose the interior conductor 80. This conductor 80 can become easily bent and attached to the respective soldering pad 56 to complete the installation of the wire 28 for the winding set 26.

Referring again to FIGS. 1-6, the use of the continuous wires 28 of the winding set 26, as well as the securing notches 52 and pre-tinned soldering pads 56, creates strain relief features. These strain relief features are used to limit the material stresses experienced within the wires 28, the PCB 10 and other components of the motor 12 during manufacture and use. The improved construction of the stator 14 for the motor 12 via a novel means of connection of the wires 28 of the stator core 18 directly to the PCB 10 without an intermediate terminal creates the integrated strain relief within these components. As discussed herein, the features located within and near the edge 50 of the PCB 10, typically in the form of the securing notches 52 and pre-tinned soldering pads 56, create the strain relief features. These strain relief features serve to clamp on the insulation layer 78 of the wire 28, while the mechanically stripped and exposed interior conductor 80 of the wire 28 is soldered to pre-tinned solder pads 56 on the PCB 10. The securing notches 52 also provide a guide around which the wire 28 can be bent for soldering the conductor 80 of the wire 28 to the soldering pad 56.

Utilizing the plurality of soldering structures 22 in the PCB 10, the securing notches 52 and pre-tinned soldering pads 56 provide an integral strain relief feature of the PCB 10 that minimizes stresses that are placed upon the various wires 28 of the winding set 26 during manufacture of the electric motor 12. These strain relief features minimize breakage and other damage that may occur to the solder joint or fatiguing of the wires 28 of the winding set 26, and other components of the electric motor 12.

The PCB 10 incorporating the soldering structures 22 can be utilized within a wide variety of electric motors. Such motors can include, but are not limited to, brushless DC motors, synchronous A/C motors, switched reluctance, synchronous reluctance and other similar motor applications that utilize a stator 14 and a winding set 26.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A stator of an electric motor, the stator comprising:
    a stator core having a plurality of teeth;
    a printed circuit board (PCB) that is fixed with respect to the stator and includes a plurality of soldering structures defined within a surface of the PCB; and
    a winding set that is disposed on the plurality of teeth, wherein the winding set includes at least one wire that is wound around the plurality of teeth to at least partially define stator poles, wherein each wire of the winding set includes opposing ends that are attached to the PCB at a dedicated soldering structure of the plurality of soldering structures, wherein the plurality of soldering structures are defined at an edge of the PCB and wherein each soldering structure includes a securing notch that is defined within the edge of the PCB, and wherein the stator core includes aligning towers that are aligned with a respective securing notch of the plurality of soldering structures.

2. The stator of claim 1, wherein each securing notch is aligned with a corresponding soldering pad, wherein each corresponding soldering pad is pre-tinned.

3. The stator of claim 2, wherein each securing notch of the plurality of soldering structures is configured to position the at least one wire in a soldering position so that the at least one wire can be stripped and soldered to the corresponding soldering pad, while the at least one wire is retained in a respective securing notch.

4. The stator of claim 3, wherein each securing notch is configured to extend more than 180 degrees around an insulation layer of the at least one wire to secure the at least one wire in the soldering position.

5. The stator of claim 2, wherein the corresponding soldering pads are pre-tinned during a Surface Mount Technology (SMT) Process.

6. The stator of claim 1, wherein each aligning tower includes a wire-receiving interior channel that positions the at least one wire in alignment with the respective securing notch, and wherein the at least one wire is a continuous wire that is free of intermediary terminals.

7. The stator of claim 6, wherein the at least one wire extends from a first dedicated soldering structure of the PCB, around the plurality of teeth of the stator core and to a second dedicated soldering structure of the PCB.

8. A stator of an electric motor, the stator comprising:
a stator core having a plurality of teeth;
a printed circuit board (PCB) attached to the stator core and having a plurality of soldering structures defined therein; and
a winding set made up of at least one wire, wherein each wire of the at least one wire extends from a first end that is attached to a first soldering structure of the plurality of soldering structures, around at least a portion of the plurality of teeth and to a second end that is attached to a second soldering structure of the plurality of soldering structures, wherein each wire is a continuous section of wire that is free of intermediate terminals.

9. The stator of claim 8, wherein the plurality of soldering structures are defined at an edge of the PCB and wherein each soldering structure includes a securing notch that is defined within the edge of the PCB.

10. The stator of claim 9, wherein each securing notch is aligned with a corresponding soldering pad.

11. The stator of claim 10, wherein the respective securing notch is configured to selectively fix a portion of the at least one wire in a soldering position in relation to the corresponding soldering pad, wherein the soldering position is characterized by the at least one wire being located to allow for stripping and soldering while the at least one wire is in the soldering position.

12. The stator of claim 10, wherein each of the corresponding soldering pads are incorporated within respective soldering structures of the plurality of soldering structures.

13. The stator of claim 10, wherein each corresponding soldering pad is pre-tinned, and wherein each corresponding soldering pad is pre-tinned during a Surface Mount Technology (SMT) Process.

14. The stator of claim 8, wherein the at least one wire extends from a first dedicated soldering structure of the PCB, around the plurality of teeth of the stator core and to a second dedicated soldering structure of the PCB.

15. An electric motor comprising:
a printed circuit board (PCB);
a wire-securing structure that is positioned proximate the PCB;
a stator having a plurality of poles; and
a wire that extends from a first end attached to the PCB at a first soldering pad, through a first portion of the wire-securing structure, around at least a portion of the poles of the plurality of poles, through a second portion of the wire-securing structure and to a second end attached to the PCB at a second soldering pad, wherein the wire includes a continuous and uninterrupted conductor.

16. The stator of claim 15, wherein the wire-securing structure is at least partially defined within an edge of the PCB.

17. The stator of claim 15, wherein each of the first and second soldering pads are positioned adjacent respective securing notches of the wire-securing structure, the respective securing notches being defined within an edge of the PCB, wherein the first and second soldering pads are pre-tinned during a Surface Mount Technology (SMT) Process.

18. The stator of claim 17, wherein the wire-securing structure further includes aligning towers that are positioned in alignment with the respective securing notches of the PCB, wherein each aligning tower includes an interior channel that positions the wire in alignment with the respective securing notches.

19. The stator of claim 17, wherein the respective securing notches are configured to selectively fix the first and second ends of the wire in a soldering position in relation to the PCB, wherein the soldering position is characterized by the first and second ends of the wire being oriented to allow for stripping and soldering of the wire while the first and second ends of the wire are in the soldering position.

20. The stator of claim 17, wherein the respective securing notches are configured to extend more than 180 degrees around an insulation layer of the wire to secure the wire in a soldering position.

* * * * *